United States Patent [19]

Noto et al.

[11] Patent Number: 4,543,147
[45] Date of Patent: Sep. 24, 1985

[54] LAMINATING PROCESS AND APPARATUS

[75] Inventors: Vincent H. Noto; Stanley Yalof, both of San Diego, Calif.

[73] Assignee: Tetrahedron Associates, Inc., San Diego, Calif.

[21] Appl. No.: 642,545

[22] Filed: Aug. 20, 1984

[51] Int. Cl.[4] .............................................. B32B 31/00
[52] U.S. Cl. .................................... 156/288; 100/137; 100/196; 100/207; 156/307.1; 156/311; 156/312; 156/358; 156/362; 156/539; 156/583.1; 414/37
[58] Field of Search ...................... 156/288, 311, 307.1, 156/312, 358, 362, 583.1, 539; 100/137, 207, 196; 414/37

[56] References Cited

U.S. PATENT DOCUMENTS 2,903,040  9/1959  Schonzeit ............................ 100/137
3,170,189  2/1965  Hütter ................................. 100/207
4,392,909  7/1983  Bohn et al. .......................... 156/311

Primary Examiner—John J. Gallagher
Attorney, Agent, or Firm—Charmasson & Holz

[57] ABSTRACT

A process and apparatus for forming a series of plastic laminate samples one-by-one in a semi-continuous manner. Samples pass continuously one after the other through a series of heating, compressing, and cooling steps. Each sample is heated and pressed for a predetermined interval in a first compression press, then passed through a series of levels in a stack in a stacking press. The sample is passed from the last level of the stacking press to a cooling press, where it is cooled for the same predetermined interval of time. Thus samples are stepped one after another through the apparatus, with samples at each step moving simultaneously to the next successive step at predetermined intervals.

27 Claims, 5 Drawing Figures

LAMINATING PROCESS AND APPARATUS

BACKGROUND OF THE INVENTION

The present invention relates to a process and apparatus for forming a plastics laminate.

Plastics laminates are normally formed by the steps of heating, compressing and cooling while maintaining registration of the various layers of material forming the laminate. Such laminates are used, for example, to make printed circuit boards.

One known apparatus for forming laminates is the manual compression press where two heated platens are formed together by a hydraulic ram. The laminate materials are placed between the platens, then compressed and heated. The platens are then cooled to below some critical temperature so that the material will solidify and stiffen. This procedure is very slow, since it takes an appreciable time to heat up and then cool down the platens. This also causes appreciable energy losses.

Separate heating and cooling presses are sometimes used in the process. This saves time and energy, but is still relatively slow since any one laminate sample must be heated, or cured, for 30 minutes or more.

Another process involves the use of a tiered press, in which several laminate samples can be cured simultaneously. However there are mechanical difficulties in loading and unloading a relatively high stack from several layers simultaneously. Both the heating and cooling press will have several tiers, with complex systems for transfer from one press to another and elevator systems for loading and unloading. If the complex transfer mechanism fails at any stage, materials may be stuck between the presses, causing partial cure and the ruin of possibly thousands of dollars worth of material.

SUMMARY OF THE INVENTION

It is an object of the present invention to provide a laminating process and machine with a faster throughput.

It is a further object of the present invention to provide a laminating process and machine which is relatively efficient and loses less energy than previous processes.

According to one aspect of the invention a multi-step process for sequentially forming a series of plastics laminate samples is provided, comprising: passing materials to form samples one after the other through the following steps:
 (i) supplying materials to form a sample to a compression press;
 (ii) heating and pressing the sample in the compression press for a predetermined transfer time;
 (iii) passing the sample to a stacking press;
 (iv) passing the sample through the various levels of the stack in the stacking press and heating and pressing it for the predetermined transfer time at each level;
 (v) passing the sample from the last level of the stacking press to a cooling press;
 (vi) cooling the sample for the predetermined time in the cooling press;
 (vii) passing the sample from the cooling press; such that samples are passed one by one along the process steps and treated samples pass from the cooling press at a rate equal to the predetermined transfer time.

In this process samples move simultaneously from one press to another, or from one level to another in the stacking press, at a predetermined transfer time. The stacking press is a press having top and bottom openings in which layers of samples are stacked one on top of the other. Thus a single layer is passed onto the stack at a time. Preferably, layers are stacked one on top of the other up to the limit of the press opening. After this limit is reached, each time an additional layer is stacked on top the bottom layer is simultaneously slid out of the bottom into the cooling press. Alternatively, samples can be stacked upwards, passing from the heating press to the bottom opening and from the top into the cooling press.

The transfer time is preferably equal to the time required for the material to flow and gel in the first press. Thus the sample is transferred from the compression press to the stacking press when it reaches its gel point. Each sample will be in the stacking press for a time sufficient to complete the curing process.

In the preferred embodiment of the invention a preheating step is used in the process. Thus materials to form a sample are initially passed to a preheating press, where the sample materials are preheated for the predetermined time interval to reach the gel point before being transferred to the next press or compression press, where the sample is heated for the predetermined time, before being passed to the stacking press. The stacking press in the preferred embodiment performs heating only.

This process has a relatively high throughput since a plurality of samples are at various stages in the curing process simultaneously, and treated samples are produced at a rate equal to the transfer time. Thus with a typical transfer time of about 3 minutes, one sample is produced every 3 minutes.

According to another aspect of the invention an apparatus for producing laminate samples is provided, comprising:
 a first compression press for heating and pressing sample materials;
 a second, stacking press for stacking a plurality of samples one on top of the other, and heating and pressing samples in the stack;
 a cooling press for cooling samples;
 means for transferring materials for forming a sample one by one to the first press;
 means for transferring samples one by one from the first press to a first level of the stacking press;
 means for stacking samples from one level to the next throughout all the levels of the stacking press;
 means for transferring samples one by one from the last level of the stacking press to the cooling press;
 means for transferring samples one by one out of the cooling press; and
 means for operating the transferring means at a predetermined transfer rate to transfer samples between the various presses and levels substantially simultaneously at intervals equal to the predetermined rate.

In the preferred embodiment of the invention there are three presses in line with each other, the first two presses in the line each having an upper opening for heating and a lower opening for cooling. The third press in the line is the stacking press. Thus samples are passed one by one through the upper openings of the first and second presses to the top of the stack in the stacking press, and from the bottom of the stack through the lower openings of the first two presses. Samples pass from one press to the next and are stacked down in the stacking press at predetermined intervals equal to the transfer time. Clearly the arrangement could be reversed, with the lower openings of the first two presses being heating levels and the upper openings being cooling levels. The stacking press will then operate to stack the samples upwards rather than downwards. Thus there is preferably a preheating stage and a post cooling stage in the process.

DESCRIPTION OF THE PREFERRED EMBODIMENT OF THE INVENTION

Figure 1:
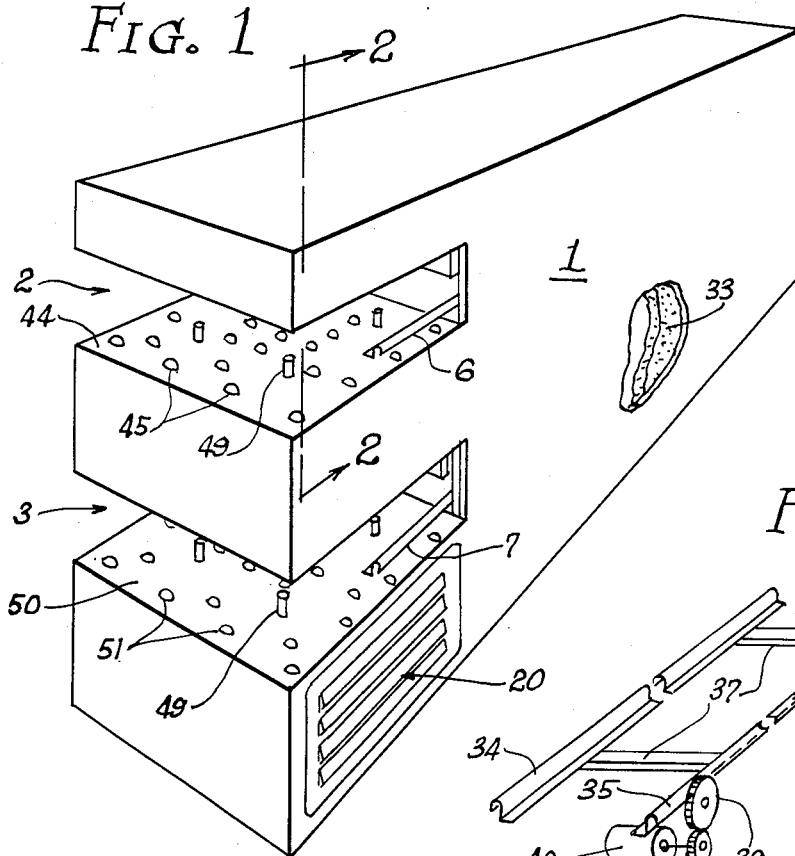
FIG. 1 is a perspective view of the laminating apparatus according to a preferred embodiment of the invention.

As shown in the drawings, a laminating apparatus according to a preferred embodiment of the invention comprises a housing 1 having inlet and outlet jaws 2 and 3 arranged one on top of each other for loading and unloading samples. A series of heating and cooling presses are mounted in the housing to define a laminating path for samples 4 between the inlet jaws 2 and the outlet jaws 3.

The samples 4 are carried along the laminating path on trays 5 which are supported on upper guide rails 6 in an upper part of the apparatus, and on lower guide rails 7 in a lower part of the apparatus. The rails 6 and 7 are reciprocally driven by a drive mechanism 8, as will be described in more detail below.

Figure 3:
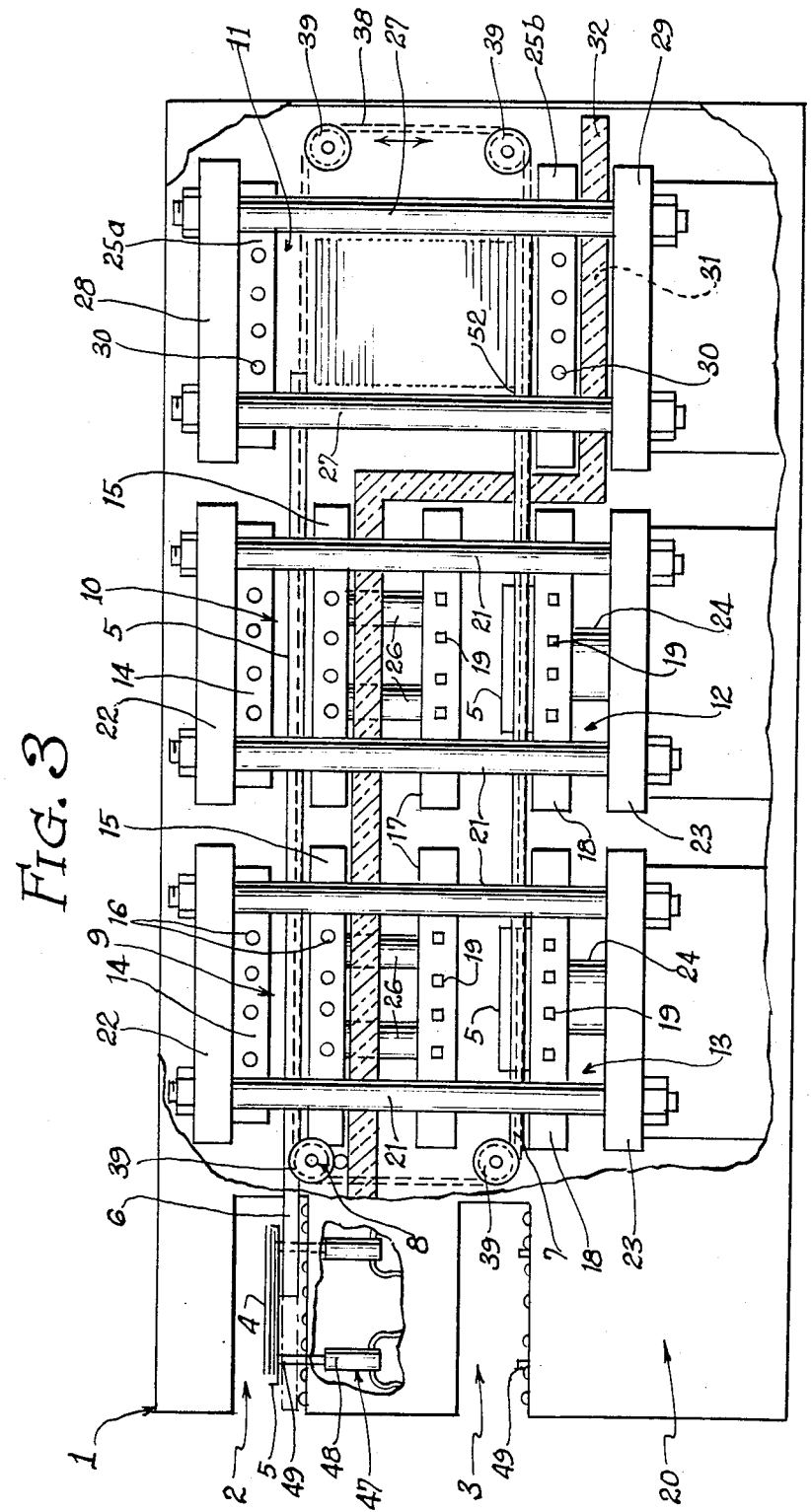
FIG. 3 is a cut away side view of the machine showing the various presses.

The various presses in the laminating path comprise first and second heating presses 9 and 10, a stacking press 11, and first and second cooling presses 12 and 13, as shown in FIG. 3. The presses define a generally circular path between the inlet and outlet jaws 2 and 3, with the heating presses being aligned with the top level of the stacking press and the cooling presses being aligned with the bottom level of the stacking press.

As shown in FIG. 3, each heating press comprises upper and lower opposed platens 14, 15 through which heating elements 16 pass. Similarly, each cooling press 12, 13 comprises upper and lower opposed platens 17, 18 through which cooling pipes 19 pass. The pipes 19 are supplied with cooling fluid from a compresser (not shown) mounted in an area 20 of the housing 1 below exit jaws 3.

The platens 14, 15 of the first heating press 9 and the platens 17, 18 of the second cooling press 13 are supported one on top of each other on posts 21 arranged in a square between support plates 22, 23. The upper platens 14 of the two presses are rigidly mounted on the posts, while the other platens 15, 17, 18 are slidably mounted. Hydraulic rams 24 act between the lower support plate 23 and the lower platen 18 of the cooling press 13. Spacers 26 are interposed between the upper platen 17 of the cooling press and the lower platen 15 of the heating press 9, respectively. The platens of the second heating press 10 and first cooling press 12 are mounted in a similar fashion, and like reference numerals have been used for equivalent parts.

The stacking press 11 stacks samples one on top of the other and heats all the layers in the stack. The press 11 comprises upper and lower platens 25a, 25b supported on posts 27 arranged in a square between support plates 28 and 29. Heating rods 30 extend through the platens 25a and 25b. The upper platen 25a is fixed, while the lower platen 25b is slidably mounted and driven by a hydraulic ram 31 acting between the lower support plate 29 and the platen 25b.

An insulating barrier 32 is located between the heating presses 9, 10 and 11 and the cooling presses 12 and 13, so as to reduce heat dissipation between the heating and cooling areas of the apparatus. As shown in FIG. 1, the housing 1 is also provided with an inner layer 33 of insulating material to reduce energy losses.

Figure 4:
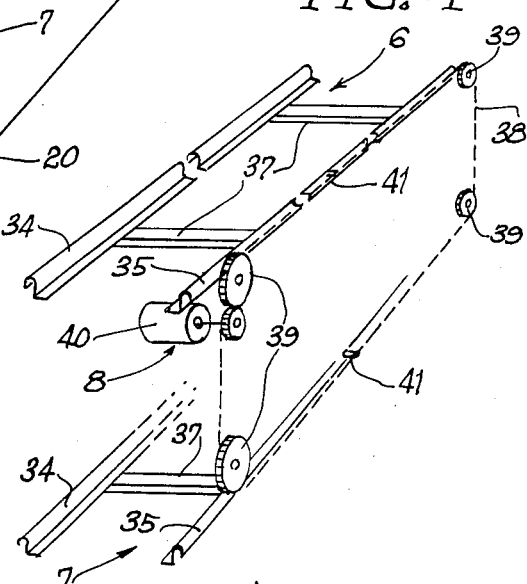
FIG. 4 diagramatically shows the chain drive mechanism of the apparatus.
Figure 5:
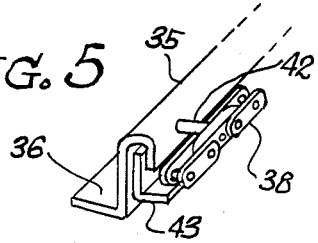
FIG. 5 is a detailed view showing the attachment of a guide rail to the drive mechanism.
Figure 2:
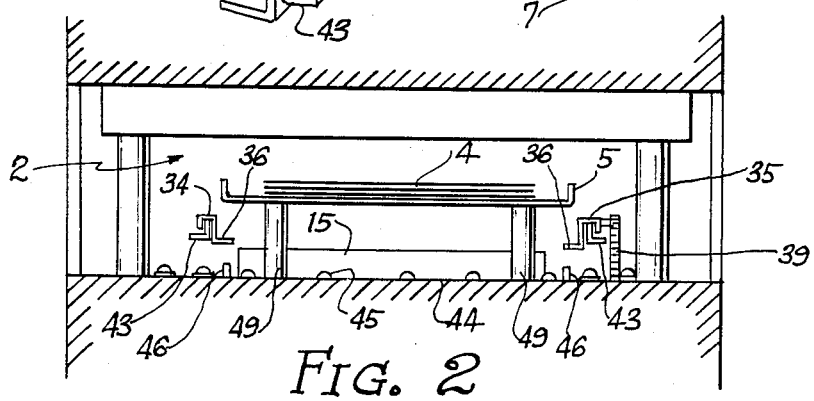
FIG. 2 is a vertical cross-section through the entry jaw of the machine on the line 2—2 of FIG. 1.

Referring now to FIGS. 2, 3, 4 and 5, the drive mechanism 8 for conveying samples 4 on their trays 5 through the various presses will be described. The upper guide rails 6 and the lower guide rails 7 each comprise a pair of opposed, inverted U-shaped members 34, 35, respectively, as seen in FIGS. 2 and 4 each having an inwardly facing ledge 36 on which the trays 5 rest. The members 34, 35 are secured together by spaced cross-bars 37. The drive mechanism 8 comprises an endless chain 38 located on rollers 39, one of which is driven by a suitable reciprocating motor 40 to rotate the chain 38 repeatedly in opposite directions. The upper and lower members 35 of the rails are attached to the chain 38 at intermediate points 41 by means of a suitable securing device, such as a pin 42 as seen in FIG. 5. The members 34, 35 of the upper and lower rails are guided to slide on rigid tracks 43 as seen in FIGS. 2 and 5.

As the chain 38 reciprocates, the upper rails and lower rails will be driven back and forth on the tracks 43 in opposite directions. The upper rails 6 move between an extended position in which they project out into the entry jaws 2, and a retracted position in which they project at their opposite ends into the upper opening of the stacking press 11. The lower rails 7 move similarly between extended and retracted positions, such that when one pair of rails is extended, the other is retracted, and vice versa.

Trays 5 carrying samples 4 can be loaded and unloaded at the jaws 2 and 3 from any of three directions, that is from the front end or from either side of the jaws.

The lower surface 44 of inlet jaws 2 is provided with a locating mechanism for automatically centering a loaded tray for pick-up by the upper rails 6. The mechanism basically comprises a plurality of ball bearings 45 mounted in the surface 44 which are of varying size such that they are largest at the outer edges of the surface 44 and gradually reduce in size towards the center of the surface 44, as seen in FIG. 2. This causes a tray 5 loaded at any edge of the surface 44 to settle towards the center. Microswitches 46 are provided for detecting when the tray is properly centered. An arrangement of four microswitches is provided so that the tray is picked up when all four microswitches are activated simultaneously.

The microswitches 46 are associated with a lifting mechanism 47 comprising a square array of four hydraulic cylinders 48 (see FIG. 3) associated with lift rods 49. When the mechanism 47 is activated by the microswitches 46, the lift rods 49 rise up to engage the tray 5 and lift it above the level of the rails 6, as seen in FIG. 2. The rails 6 are then driven out to the extended position beneath the tray, and the lift rods 49 retract to lower the tray onto the rails.

The lower surface 50 of the lower jaws 7 also has a plurality of ball bearings 51 mounted in its face to aid in rolling trays out of the jaws. An hydraulic lifting mechanism (not shown) associated with lift rods 49 as provided in the upper jaws is provided for lifting trays off the lower rails 7 and lowering them onto the surface 50 when the rails are retracted.

The various stages in the laminating process utilizing the above apparatus will now be described. A series of trays carrying material to form laminated samples is fed one by one into the entry jaws 2 at predetermined intervals. When the first tray 5 is properly centered, it is lifted up by the lift rods 49 and the upper rails 6 are driven out to the extended position below the tray. The tray is then lowered onto the rails 6 and the rails are retracted into the apparatus. FIG. 3 shows the rails 6 on their way out to the extended position to pick up a tray.

When the rails 6 are retracted, the loaded tray 5 is positioned between the platens 14, 15 of the first heating press, which is a pre-heating press. The lower platen 15 is raised, passing between the rails 6 to engage the tray and lift it to press the sample between the platens. At this point the rails 6 are driven back out to the extended position to pick up the next tray. The tray in the entry jaws 2 and the tray between the platens are simultaneously lowered onto the rails 6 after a predetermined interval, equal to a selected transfer time and the rails 6 are driven back to the retracted position. At this point the first tray is located between the platens of the second heating press, and the second tray is located between the platens of the first heating press. The lower platens 15 are raised simultaneously, passing between the rails to pick up the trays and press the samples against the upper platens 14. The rails 6 are again driven out into the extended position to pick up the next tray.

The three trays now in the laminating path are lowered simultaneously back onto the rails 6 after a predetermined interval. The rails are then driven back to the retracted position. At this point the first loaded tray is at the upper level of the stacking press 11. Thus the rails 6 are long enough to carry three spaced trays simultaneously and to correctly locate them in the respective presses.

At this point the platens of the heating presses and the stacking press are raised simultaneously. The first tray is lifted by the stack and the rails 6 are driven back to the extended position. After the predetermined interval or transfer time, the platens are lowered. The trays in the heating presses are picked up by the rails 6, and the first tray drops down onto the stack in the stacking press. This may be arranged with suitable retractable stops in the press for example.

After the stacking press is filled with a stack of trays between its top and bottom openings in this manner, the bottom tray of the stack is removed by the rails 7 at the same time as a new tray is introduced at the top level. Thus as the lower platen 25b of the multi-level press is lowered with the rails 7 in their retracted position projecting into the lower level of the press, a suitable retractable catch or stop 52 is arranged to catch all the trays except the lowermost tray, which drops onto the rails 7. The lowermost tray is then carried by the rails 7 into the first cooling press 12.

The trays progress through the cooling presses 12 and 13 on the rails 7 in the same way as they moved through the heating presses.

A tray withdrawn from the stacking press will be moved into position between the platens 17, 18 of the first cooling press 12. The lower platen is actuated to lift the tray off the rails and compress it against the upper platen, and the rails 7 then reciprocate back to the retracted position with their inner ends located in the stacking press. The lowermost tray in the press 11 and the tray in cooling press 12 will be simultaneously lowered onto the rails 7 after the predetermined interval, and the rails 7 will then move out of the stacking press until the trays are located between the platens of each cooling press. In the next cycle, the tray in the second cooling press will be moved out into the exit jaws 3. At this point it will be lifted by the rods 49 and lowered onto the ball bearings for removal from the jaws 3 once the rails 7 are again retracted.

Thus trays carrying samples in various stages of curing and lamination are continuously cycled through the various stages in the apparatus. The rails 6 and 7 are reciprocated back and forth in opposite directions at predetermined intervals or transfer times corresponding to the intervals between successive operations of the presses. It will be understood that all the presses are operated simultaneously. Thus trays are lifted off the upper and lower rails simultaneously by the lower platens of the presses, the rails are then moved to the opposite position, and the trays are lowered onto new positions on the rails simultaneously after a predetermined interval. The rails are then moved back to their initial positions such that each tray and its sample is at the next successive stage in the apparatus.

Trays are loaded onto the entry jaws 2 one by one at intervals corresponding to the predetermined interval or transfer time, and trays carrying laminated samples will be delivered one by one at the same interval to the exit jaws, where they are rolled off from any of the three open directions by a suitable unloading device.

The predetermined interval, or transfer time, at which samples are transferred from press to press is dictated by the type of material being processed. The first few minutes of cure have been found to be the most critical. During this time, the heated material flows, coalesces, and knits together into a long chain molecule. Following this period, the material continues to knit under temperature and pressure, but there is no further flow.

The transfer time is preferably arranged such that samples have reached this critical point, called the gellation point, when they leave the first heating press. The first heating press is a pre-heating press. Samples which have reached gellation will retain their shape during transfer from press to press.

The time necessary for samples to gel will vary according to the thickness of the sample and the chemistry of the material, but it is typically about two to three minutes for polymeric plastics materials.

Thus in one example of the invention samples are simultaneously advanced through the various stages of the apparatus at about three minute intervals. The rails are operated to pick up samples, advance them to the next press and reciprocate back to the opposite position, once every three minutes. The presses all operate simultaneously in co-ordination with the reciprocation of the rails. Thus the throughput in this example will be one sample every three minutes, or about 20 samples an hour, which is over three times greater than the most efficient shuttle press.

It will be understood that each sample will spend a time equal to the transfer time, typically about three minutes, a each level in the stacking press. They move down the stack as the lowermost sample is withdrawn by the rails 7. At this point all the samples are released to drop down a level, and a new sample is introduced to the top of the stack. The height or number of levels in the stacking press can be arranged such that each sample is in the press for a time sufficient to complete the curing process. The time each sample spends in the press will be equal to the number of levels, or samples in the stack multiplied by the transfer time. The number of levels depends upon the thickness of each sample; and can be adjusted by adding or removing suitable spacers between each sample and its supporting tray. The apparatus of this invention contains the heating and cooling areas within separate insulated compartments, thus conserving energy. The entire apparatus is preferably enclosed within an insulated housing which contains the mechanical mechanisms and electronic controls for the apparatus.

Although two heating and two cooling presses have been shown in the specific embodiment described above, the pre-heating press 9 and post-cooling press 13 could be eliminated. Thus samples would pass through a single heating press to the stacking press after an interval equal to the transfer time and then through a single cooling press to the exit.

The apparatus allows a significantly higher throughput than conventional laminating presses, and provides a semi-continuous production line type process for producing laminated samples. The production line or laminating path includes an upper level of heating and compressing stages, a vertical stacking and pressing stage with its upper level aligned with the last heating and pressing stage, and a lower level of cooling and pressing stages aligned with the lowest level of the stacking and pressing stage. Thus the path of samples doubles back on itself to conserve space, allowing the heating and cooling stages to be stacked one on top of each other with suitable insulating barriers. Clearly the heating and cooling stages could be reversed with the stacking press arranged to stack samples upwards rather than downwards.

Alternative arrangements of the heating and cooling presses may be used. For example, the flow path could be in a single plane with a suitable modification of the stacking press to provide a mechanism to push the samples upwards after they had been stacked downwards. In this arrangement the heating presses would be on one side of the stacking press with the cooling presses on the opposite side, and the entry and exit jaws would be at opposite ends of the apparatus.

The apparatus operates relatively smoothly and efficiently, with reciprocating rails for stepping all the samples in the apparatus at any point simultaneously from each stage to the next successive stage at predetermined intervals. No complicated elevator mechanism or simultaneous batch loading and unloading mechanisms are required and thus there is significantly less chance of jamming which could result in partially cured samples being stuck between stages.

In the embodiment described above samples are transferred from press to press by upper and lower rails operated by a reciprocating chain drive mechanism. If the heating and cooling presses are arranged in a single plane as discussed above, the samples may be transferred by a conveyer type mechanism beneath the pressing stations. Such a mechanism may suitably comprise upper and lower steel bands above and below the samples which are released as the presses are engaged. Alternatively, some type of independent motion transfer devices may be provided between the successive stages.

The apparatus and process of this invention have many advantages over conventional laminating processes and machines. The apparatus is designed to conserve heat, uses less energy, provides a semi-continuous throughput rather than a batch-type throughput, and the throughput rate is significantly higher. The apparatus is more reliable and less likely to jam since it has less complex mechanical parts than conventional machines. Although a production line type process is provided, the apparatus takes up relatively little space because of the arrangement of the stacking press and the arrangement of the heating and cooling stages stacked one on top of each other, which allows the line or path of samples to double back on itself.

While the invention has been particularly shown and described with reference to the preferred embodiment, it will be understood that modifications can be made to the disclosed embodiment without departing from the scope of the invention, which is defined in the appended claims.

What is claimed is:

1. A process for sequentially forming a series of laminated samples, comprising passing samples one after the other at predetermined intervals through a series of laminating steps
   (a) supplying sample materials to a first heating press;
   (b) heating and pressing a sample for the predetermined interval in the first press;
   (c) passing the sample to the first level of a stack in a stacking press;
   (d) passing the sample through the various levels of the stack in the press and heating and pressing it for the predetermined interval at each level;
   (e) passing the sample from the last level of the stack to a cooling press;
   (f) cooling the sample for the predetermined interval in said cooling press; and
   (g) removing the sample from the cooling press,
      said samples being passed one after the other from each step to the next subsequent step simultaneously at said predetermined intervals such that samples are removed from said cooling press at a rate equal to said predetermined interval.

2. The process of claim 1, wherein said predetermined interval is equal to the time required for the sample material in the first press to reach gellation point.

3. The process of claim 2, wherein said predetermined interval is between 2 and 4 minutes.

4. The process of claim 1, including the steps of supplying samples one after the other to a pre-heating press and heating and pressing them for said predetermined interval before passing them from the pre-heating press to the first heating press.

5. The process of claim 1, including the further steps of passing the sample from the cooling press to a second cooling press, cooling the sample for the predetermined interval in the second cooling press, and removing the sample from the second cooling press.

6. The process of claim 1, wherein the samples are passed one after another in a generally continuous path between an entry and an exit positioned one above the other, said path comprising an upper, heating level aligned with an uppermost level of the stacking press and a lower, cooling level aligned with a lowermost level of the stacking press.

7. The process of claim 6, including the further steps of detecting delivery and centering of a sample at said inlet, and driving a transfer mechanism to pick up the detected sample for delivery to the first press.

8. The process of claim 1, wherein said presses are operated simultaneously to pick up and compress samples for said predetermined interval, and subsequently to release the samples for transfer to the next step in the process.

9. The process of claim 1, wherein samples are transferred from one step to another by a continuous reciprocating drive mechanism.

10. An apparatus for producing laminated samples, comprising:
a first press for heating and pressing sample materials;
a stacking press having upper and lower openings one of the openings for heating and pressing a stack of samples between the levels of the openings, one of the openings being aligned with the first press;
a cooling press for cooling and compressing samples;
means for transferring samples one after another into the first press, from the first press into said one opening of the stacking press, from one level to the next through all the levels of the stack, from the other opening of the stacking press into the cooling press, and out of the cooling press;
means for operating said presses simultaneously to compress samples within the presses for a predetermined interval; and
means for operating said transferring means to simultaneously transfer samples from each stage to the next in the apparatus at a transfer time equal to said predetermined interval, said transferring means being synchronized with said press operating means.

11. The apparatus of claim 10, wherein said predetermined interval is equal to the time necessary for the sample materials to reach gellation point.

12. The apparatus of claim 10, wherein said first heating press and said cooling press are stacked one on top of each other, said heating press is aligned with the upper level opening of said stacking press, and said cooling press is aligned with the lower level opening of said stacking press.

13. The apparatus of claim 12, wherein an insulating barrier is located between said cooling press and said heating and stacking presses.

14. The apparatus of claim 12, including a preheating press for preheating samples, said transferring means transferring preheated samples one after another from said preheating press into said first-mentioned press at said predetermined interval.

15. The apparatus of claim 12, wherein said means for transferring samples includes vertically spaced tracks, one set of tracks being aligned with said first heating press and said first level of said multi-level press and the other set of tracks being aligned with said last level of said multi-level press and said cooling press, rail means for conveying samples slidably mounted on said tracks, and drive means for driving said rail means to reciprocate between retracted positions in which they extend into said multi-level press and extended positions in which they are retracted out of said multi-level press and extend out of the opposite side of said heating press and cooling press, respectively, said drive means operating to drive said rail means in opposite directions such that said rail means on one set of tracks projects into said multi-level press when said other rail means is withdrawn, and vice versa, said operating means acting to reciprocate said track means at said predetermined intervals synchronized with said press operation.

16. The apparatus of claim 15, wherein said drive means comprises a reciprocating endless chain drive mechanism.

17. The apparatus of claim 10 for producing samples by stepping them through various stages in a flow path defined through the apparatus between entry and exit jaws, wherein a pre-heating press is provided in the flow path between said entry jaws and said first heating press, and a post-cooling press is provided in the flow path between said first-mentioned cooling press and said exit jaws, and said transferring means transfers samples one after another from one press to the next in the flow path and from one level to the next in said multi-level press at intervals equal to said predetermined interval.

18. The apparatus of claim 17, wherein said entry jaws and said heating presses are aligned at an upper level in said apparatus and said cooling presses and said exit jaws are aligned at a lower level in said apparatus.

19. The apparatus of claim 18, wherein said pre-heating and post-cooling press are stacked one on top of each other and said first heating the cooling presses are stacked one on top of the other, said press operating means operating all of said presses simultaneously.

20. The apparatus of claim 18, wherein said transferring means comprises a reciprocating drive mechanism for simultaneously advancing samples one by one from each stage to the next stage in the flow path, said drive mechanism reciprocating between a first position for picking up a sample at said entry jaws and a second position for advancing a series of samples at the various stages to the next successive stages in the apparatus, said press operating means including means for picking up samples from said drive mechanism in said second position.

21. The apparatus of claim 20, wherein said drive mechanism includes upper and lower level tracks and rails for conveying samples slidably mounted on said tracks, and reciprocating drive means for driving said upper and lower rails between advanced positions in which they project into said entry and exit jaws, respectively and retracted positions in which they project into said first and last levels of said multi-level press, respectively, said drive means operating to drive said upper and lower rails in opposite directions such that samples are alternately picked up at said entry and delivered to said exit.

22. The apparatus of claim 21, wherein said drive means comprises a continuous, reciprocating chain drive mechanism linked at upper and lower levels to said upper and lower rails.

23. The apparatus of claim 17, wherein an insulating barrier is provided between said cooling presses and said heating and stacking presses.

24. The apparatus of claim 10, wherein said presses are enclosed within an insulated housing.

25. The apparatus of claim 10, including entry jaws for loading samples, said transferring means being associated with said entry jaws for picking up loaded samples, and exit jaws for unloading samples, said transferring means being associated with said exit jaws for delivering laminated samples to said exit jaws.

26. The apparatus of claim 25, wherein said jaws each comprise spaced upper and lower faces defining three loading and unloading directions, said lower faces having a plurality of rolling members located therein for rolling samples into and out of said jaws, and lifting members for lifting samples onto and off said transferring means.

27. The apparatus of claim 26, wherein said rolling members comprise ball bearings, said ball bearings in said lower face of said entry jaws being of variable size, and ball bearings gradually tapering in size from the edges of said face towards the center, and sensor means are provided in said face for detecting when said samples are in a centered, pick-up position relative to said transferring means, said sensor means including means for operating said entry jaw lifting means on detection of said centered position to lift said sample for pick-up by said transferring means, and means are provided for operating said exit jaw lifting means to lift samples from said transferring means and lower them onto said lower face of said exit jaws on retraction of said transferring means.

* * * * *